(12) United States Patent
Tokuri et al.

(10) Patent No.: US 9,721,815 B2
(45) Date of Patent: Aug. 1, 2017

(54) SUBSTRATE PROCESSING APPARATUS AND SUBSTRATE PROCESSING METHOD

(71) Applicant: SCREEN Holdings Co., Ltd., Kyoto (JP)

(72) Inventors: Kentaro Tokuri, Kyoto (JP); Hiroaki Takahashi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 14/868,430

(22) Filed: Sep. 29, 2015

(65) Prior Publication Data

US 2016/0093503 A1 Mar. 31, 2016

(30) Foreign Application Priority Data

Sep. 29, 2014 (JP) ................................ P2014-198208

(51) Int. Cl.
*H01L 21/02* (2006.01)
*H01L 21/306* (2006.01)
*H01L 21/67* (2006.01)

(52) U.S. Cl.
CPC .. *H01L 21/67051* (2013.01); *H01L 21/67028* (2013.01)

(58) Field of Classification Search
None
See application file for complete search history.

(56) References Cited

U.S. PATENT DOCUMENTS

| 5,947,136 A * | 9/1999 | Abras ..................... B05C 11/08 134/104.1 |
| 2003/0170988 A1 | 9/2003 | Izumi et al. .................. 438/689 |
| 2004/0159343 A1* | 8/2004 | Shimbara ............. G11B 23/505 134/33 |
| 2004/0261817 A1* | 12/2004 | Araki ................ H01L 21/67051 134/2 |
| 2008/0066783 A1 | 3/2008 | Tanaka ........................... 134/21 |
| 2008/0190454 A1* | 8/2008 | Eitoku ............. H01L 21/67028 134/19 |
| 2009/0205684 A1* | 8/2009 | Orii ................... H01L 21/02052 134/33 |

(Continued)

FOREIGN PATENT DOCUMENTS

| JP | 11-176795 | 7/1999 |
| JP | 2002-273360 A | 9/2002 |

(Continued)

*Primary Examiner* — Shamim Ahmed
(74) *Attorney, Agent, or Firm* — Ostrolenk Faber LLP (57) ABSTRACT

In a substrate processing apparatus, chemical-solution processing is performed by supplying a chemical solution to the upper surface of a substrate in a state where a top plate is located at a first relative position. Also, cleaning processing is performed by supplying a cleaning liquid to the upper surface of the substrate in a state where the top plate is located at a second relative position closer to the substrate than the first relative position is. Moreover, dry processing is performed on the substrate by rotating the substrate in a state where the top plate is located at a third relative position closer to the substrate than the second relative position is. This allows a chemical atmosphere above the substrate to be efficiently removed during the cleaning processing. Consequently, the occurrence of particles due to the chemical atmosphere above the substrate can be suppressed during the dry processing.

4 Claims, 6 Drawing Sheets

(56) References Cited

U.S. PATENT DOCUMENTS

2012/0186607 A1* 7/2012 Higashijima ..... H01L 21/67051
134/30
2013/0180659 A1 7/2013 Itoh et al. ................ 156/345.21

FOREIGN PATENT DOCUMENTS

| | | |
|---|---|---|
| JP | 2004-158482 | 6/2004 |
| KR | 10-2003-0065394 | 8/2003 |
| TW | 200823979 A | 6/2008 |
| TW | 201322308 A | 6/2013 |

* cited by examiner

SUBSTRATE PROCESSING APPARATUS AND SUBSTRATE PROCESSING METHOD

TECHNICAL FIELD

The present invention relates to a technique for processing a substrate.

BACKGROUND ART

A conventional process of manufacturing semiconductor substrates (hereinafter, simply referred to as "substrates") involves performing various types of processing on the substrates. For example, chemical-solution processing such as etching is performed on a surface of a substrate that has a resist pattern on the surface by supplying a chemical solution onto the substrate. After completion of the chemical-solution processing, cleaning processing is performed by supplying a cleaning liquid onto the substrate, and then dry processing is performed on the substrate.

In a substrate processing apparatus disclosed in Japanese Patent Application Laid-Open No. H11-176795 (Document 1), an interrupt member is disposed in close proximity to the upper surface of a substrate to form a space between the interrupt member and the substrate when a series of processes including chemical-solution processing, cleaning processing, and dry processing are to be performed on the substrate. Then, a chemical solution and a cleaning liquid are sequentially supplied to that space, and thereafter the substrate is rotated at a high speed to complete the above series of processes. In the substrate processing apparatus, a nitrogen gas is supplied to the space between the interrupt member and the substrate, and thus the above series of processes are performed in a hypoxic atmosphere.

Similarly, in a substrate processing apparatus disclosed in Japanese Patent Application Laid-Open No. 2004-158482 (Document 2), a series of processes including chemical-solution processing, cleaning processing, and dry processing are performed on a substrate in a state where an atmosphere shielding plate is in close proximity to the upper surface of the substrate. The substrate processing apparatus starts the supply of a nitrogen gas to the space between the atmosphere shielding plate and the substrate after the cleaning processing has proceeded to some extent. In parallel with the supply of the nitrogen gas, the atmosphere shielding plate is moved to a position closer to the substrate, and at this position the cleaning processing is continued and the dry processing is performed. This enables the amount of nitrogen gas supplied to be reduced.

Since the aforementioned interrupt member is in close proximity to the substrate, the chemical solution or the cleaning liquid may adhere to the lower surface of the interrupt member and drop onto the dried substrate. The chemical solution adhering to the lower surface of the interrupt member may also dry and adhere to the substrate as particles. In addition, a chemical atmosphere (i.e., an atmosphere containing mist and fumes of a chemical solution) produced in the space between the interrupt member and the substrate is exhausted during the chemical-solution processing through an exhaust port or the like at the bottom of a cup part disposed around the substrate. However, it is difficult to efficiently suck out the chemical atmosphere from around the substrate because of the small distance between the interrupt member and the substrate.

On the other hand, if the interrupt member and the substrate are widely separated from each other during the chemical-solution processing, the amount of the chemical atmosphere that remains in the space between the interrupt member and the substrate will increase. The chemical atmosphere will be reduced to some extent during the cleaning processing by being exhausted through the aforementioned exhaust port, but still remains after the cleaning processing and may possibly cause particles during the dry processing. If the chemical atmosphere is to be removed completely during the cleaning processing, the amount of time required for the cleaning processing will increase and production efficiency will decrease.

SUMMARY OF INVENTION

The present invention is intended for a substrate processing apparatus for processing a substrate, and it is an object of the present invention to efficiently remove a chemical atmosphere above the substrate. The present invention is also intended for a substrate processing method of processing a substrate.

The substrate processing apparatus according to the present invention includes a substrate holding part for holding a substrate in a horizontal state, a substrate rotation mechanism for rotating the substrate along with the substrate holding part about a central axis pointing in an up-down direction, a chemical-solution supply part for supplying a chemical solution to an upper surface of the substrate, a cleaning-liquid supply part for supplying a cleaning liquid to the upper surface of the substrate, a shielding plate that opposes the upper surface of the substrate, a shielding-plate movement mechanism for moving the shielding plate relative to the substrate in the up-down direction, and a control part for controlling the shielding-plate movement mechanism, the chemical-solution supply part, the cleaning-liquid supply part, and the substrate rotation mechanism to perform chemical-solution processing by supplying the chemical solution to the upper surface of the substrate in a state where the shielding plate is located at a first relative position relative to the substrate in the up-down direction, to perform cleaning processing by supplying the cleaning liquid to the upper surface of the substrate in a state where the shielding plate is located at a second relative position that is closer to the substrate than the first relative position is, and to perform dry processing by rotating the substrate in a state where the shielding plate is located at a third relative position that is closer to the substrate than the second relative position is. With the substrate processing apparatus, the chemical atmosphere above the substrate can be removed efficiently.

In a preferred embodiment of the present invention, the substrate processing apparatus further includes a cup part that covers a periphery of the substrate, has an upper opening above the substrate, and receives the chemical solution from the substrate, and an exhaust port provided in the cup part at a location below the substrate and for sucking and exhausting an ambient gas to outside of the cup part. The shielding plate located at the second relative position blocks the upper opening of the cup part.

In another preferred embodiment of the present invention, the substrate processing apparatus further includes a cup part that covers a periphery of the substrate, has an upper opening above the substrate, and receives the chemical solution from the substrate, and an exhaust port provided in the cup part at a location below the substrate and for sucking and exhausting an ambient gas to outside of the cup part. The shielding plate located at the first relative position blocks the upper opening of the cup part.

In another preferred embodiment of the present invention, the substrate processing apparatus further includes a cup part that covers a periphery of the substrate, has an upper opening above the substrate, and receives the chemical solution from the substrate, and an exhaust port provided in the cup part at a location below the substrate and for sucking and exhausting an ambient gas to outside of the cup part. The shielding plate located at the third relative position blocks the upper opening of the cup part.

In another preferred embodiment of the present invention, the shielding plate includes a shielding-plate main part having a main-part lower surface that covers the upper surface of the substrate, and a shielding-plate peripheral part having an inner peripheral surface that extends downward from an outer peripheral edge of the main-part lower surface.

More preferably, an outer peripheral surface of the shielding-plate peripheral part is a cylindrical surface that extends about the central axis in the up-down direction, a diameter of the upper opening of the cup part is greater than a diameter of the outer peripheral surface of the shielding-plate peripheral part, and in a state where the shielding plate is located at any of the first relative position, the second relative position, and the third relative position, the outer peripheral surface of the shielding-plate peripheral part blocks the upper opening of the cup part by opposing an inner peripheral edge of the upper opening of the cup part in close proximity.

In another preferred embodiment of the present invention, the substrate processing apparatus further includes an exhaust port provided below the substrate and for sucking an ambient gas. The shielding plate includes a shielding-plate main part having a main-part lower surface that covers the upper surface of the substrate, and a shielding-plate peripheral part having an inner peripheral surface that extends downward from an outer peripheral edge of the main-part lower surface.

These and other objects, features, aspects and advantages of the present invention will become more apparent from the following detailed description of the present invention when taken in conjunction with the accompanying drawings.

DESCRIPTION OF EMBODIMENTS

Figure 1:
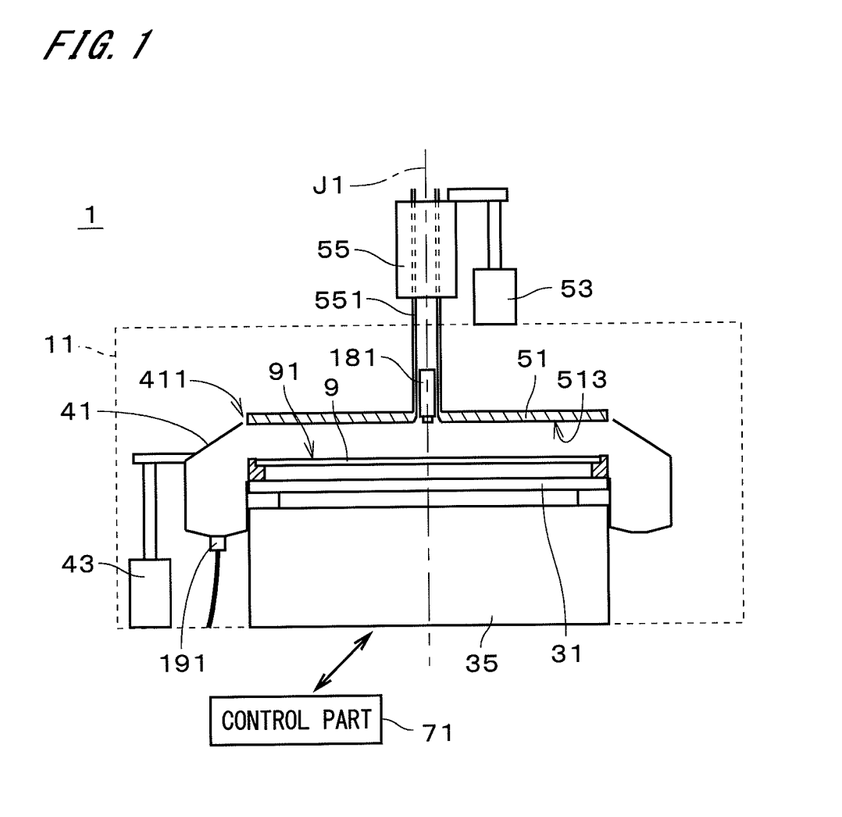
FIG. 1 illustrates a configuration of a substrate processing apparatus according to a first embodiment.

FIG. 1 illustrates a configuration of a substrate processing apparatus 1 according to a first embodiment of the present invention. The substrate processing apparatus 1 is a single-wafer apparatus for processing semiconductor substrates 9 (hereinafter, simply referred to as "substrates 9") one at a time. FIG. 1 illustrates a cross-section of part of the configuration of the substrate processing apparatus 1.

The substrate processing apparatus 1 includes a substrate holding part 31, a substrate rotation mechanism 35, a cup part 41, a cup-part movement mechanism 43, a top plate 51, a shielding-plate movement mechanism 53, a shielding-plate rotation mechanism 55, a housing 11, and a control part 71. Illustration of the control part 71 has been omitted in FIGS. 4 to 9, which will be described later. The housing 11 houses, for example, the substrate holding part 31, the cup part 41, and the top plate 51. In FIG. 1, the housing 11 is indicated by a broken line. A gas supply part (not shown) for supplying an inert gas such as a nitrogen ($N_2$) gas to the internal space of the housing 11 is provided in an upper part of the housing 11. Thus, there is a downflow of the inert gas flowing downward in the internal space of the housing 11.

The substrate holding part 31 is a generally disc-shaped member centered on a central axis J1 pointing in the up-down direction. The substrate holding part 31 is disposed below a substrate 9 and holds the outer edge of the substrate 9 in a horizontal state. The substrate rotation mechanism 35 is disposed below the substrate holding part 31. The substrate rotation mechanism 35 rotates the substrate 9 along with the substrate holding part 31 about the central axis J1.

The cup part 41 is an annular member centered on the central axis J1 and disposed radially outward of the substrate 9 and the substrate holding part 31. The cup part 41 covers the entire periphery of the substrate 9 and the substrate holding part 31 and receives a chemical solution and the like that disperses from the substrate 9 to the periphery thereof. The cup part 41 has a generally circular upper opening 411 centered on the central axis J1. In a state illustrated in FIG. 1, the upper opening 411 of the cup part 41 is located above the substrate 9. The diameter of the upper opening 411 is greater than the diameters of the substrate 9 and the substrate holding part 31. The cup-part movement mechanism 43 is disposed radially outward of the cup part 41. The cup-part movement mechanism 43 moves the cup part 41 in the up-down direction.

An exhaust port 191 is provided at the bottom of the cup part 41. The exhaust port 191 is provided in the cup part 41 at a location below the substrate 9. The exhaust port 191 allows the chemical solution and the like received by the cup part 41 to be discharged to the outside of the cup part 41 and the housing 11. The exhaust port 191 also allows an ambient gas to be sucked out in the cup part 41 and exhausted to the outside of the cup part 41 and the housing 11.

The top plate 51 is a generally disc-shaped member centered on the central axis J1. The top plate 51 is a shielding plate that opposes an upper surface 91 of the substrate 9 and shields the top of the substrate 9. The diameter of the top plate 51 is slightly smaller than the diameter of the upper opening 411 of the cup part 41. The diameter of the top plate 51 is greater than the diameter of the substrate 9, and the outer peripheral edge of the top plate 51 is entirely located radially outward of the outer peripheral edge of the substrate 9. An upper central nozzle 181 for supplying a chemical solution or the like to the central part of the upper surface 91 of the substrate 9 is provided in the central part of the top plate 51.

The shielding-plate movement mechanism 53 is provided above the housing 11 and moves the top plate 51 in the up-down direction. The shielding-plate rotation mechanism 55 is provided above the housing 11 and rotates the top plate 51 about the central axis J1. The aforementioned upper central nozzle 181 is disposed in a rotation shaft 551 of the shielding-plate rotation mechanism 55.

Figure 2:
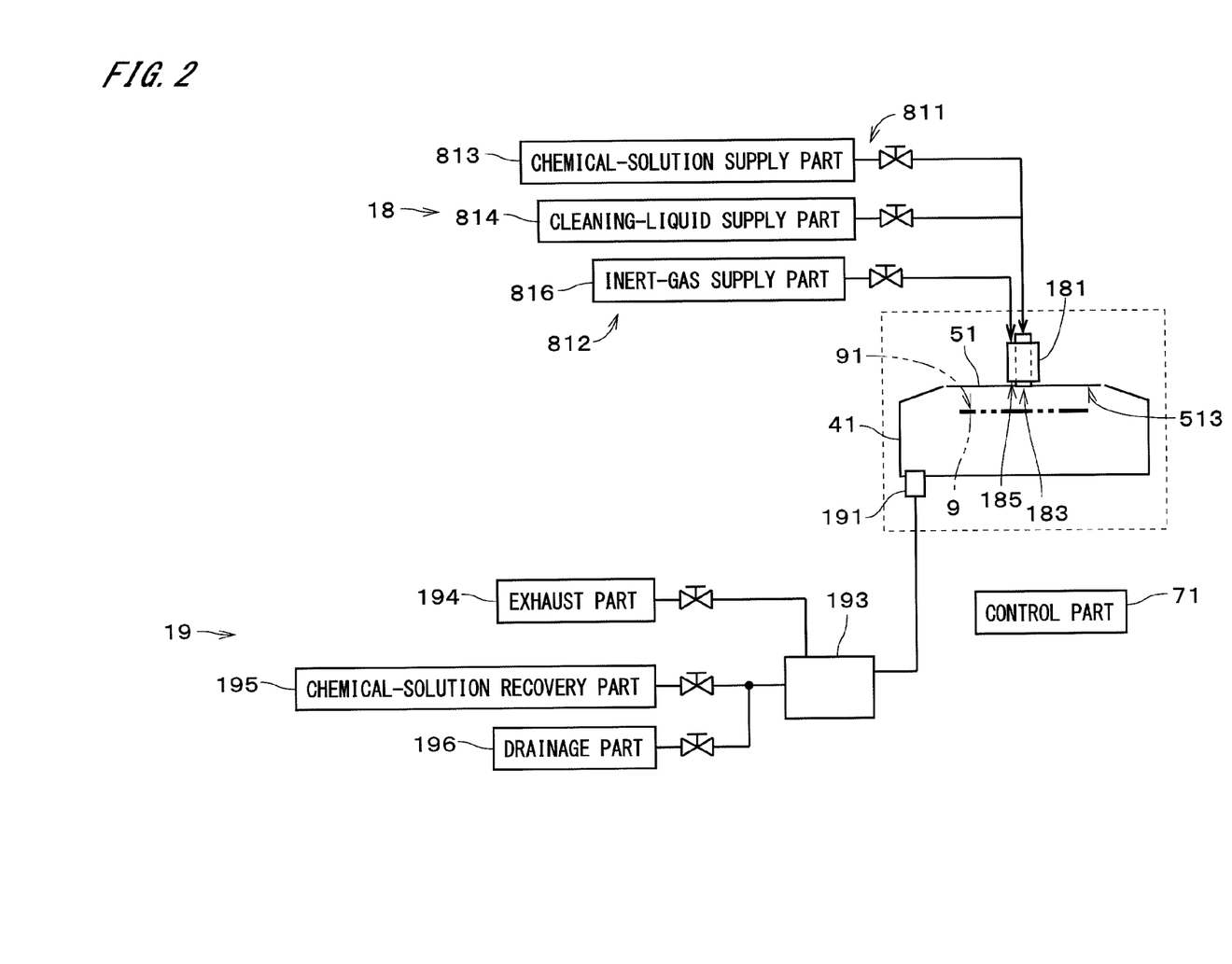
FIG. 2 is a block diagram of a gas-liquid supply part and a gas-liquid discharge part.

FIG. 2 is a block diagram of a gas-liquid supply part 18 and a gas-liquid discharge part 19 of the substrate processing apparatus 1. The gas-liquid supply part 18 includes a processing-liquid supply part 811 and a gas supply part 812. The processing-liquid supply part 811 includes the upper central nozzle 181, a chemical-solution supply part 813, and a cleaning-liquid supply part 814. The chemical-solution supply part 813 and the cleaning-liquid supply part 814 are connected to the upper central nozzle 181 via different valves. The gas supply part 812 includes the upper central nozzle 181 and an inert-gas supply part 816. The inert-gas supply part 816 is connected to the upper central nozzle 181 via a valve.

A processing-liquid outlet 183 through which a processing liquid is supplied to the upper surface 91 of the substrate 9 is provided at the central part of the lower end of the upper central nozzle 181. The chemical solution sent from the chemical-solution supply part 813 is supplied from the processing-liquid outlet 183 to the upper surface 91 of the substrate 9. The cleaning liquid sent from the cleaning-liquid supply part 814 is also supplied from the processing-liquid outlet 183 to the upper surface 91 of the substrate 9. A generally annular gas outlet 185 is provided around the processing-liquid outlet 183 at the lower end of the upper central nozzle 181. The inert gas sent from the inert-gas supply part 816 is supplied from the gas outlet 185 to a space below the top plate 51 (i.e., a space between a lower surface 513 of the top plate 51 and the upper surface 91 of the substrate 9). The lower end of the upper central nozzle 181 is located at approximately the same position in the up-down direction as the position of the lower surface 513 of the top plate 51.

The gas-liquid discharge part 19 includes the exhaust port 191, a gas-liquid separating part 193, an exhaust part 194, a chemical-solution recovery part 195, and a drainage part 196. The exhaust port 191 is connected to the gas-liquid separating part 193. The gas-liquid separating part 193 is connected to the exhaust part 194, the chemical-solution recovery part 195, and the drainage part 196 via different valves. The constituent elements of the gas-liquid supply part 18 and the gas-liquid discharge part 19 are controlled by the control part 71. The mechanisms including the substrate rotation mechanism 35, the cup-part movement mechanism 43, the shielding-plate movement mechanism 53, and the shielding-plate rotation mechanism 55 (see FIG. 1) are also controlled by the control part 71.

The chemical solution supplied from the chemical-solution supply part 813 through the upper central nozzle 181 onto the substrate 9 is, for example, a polymer remover or an etchant such as hydrofluoric acid or an aqueous solution of tetramethyl ammonium hydroxide. The cleaning liquid supplied from the cleaning-liquid supply part 814 through the upper central nozzle 181 onto the substrate 9 is, for example, deionized water (DIW). The processing-liquid supply part 811 may also include other supply parts for supplying processing liquids other than the chemical solution and the cleaning liquid described above. The gas supplied from the inert-gas supply part 816 is, for example, a nitrogen gas. The gas supply part 812 may also include other supply parts for supplying inert gases other than a nitrogen gas, or gases other than inert gases.

Figure 3:
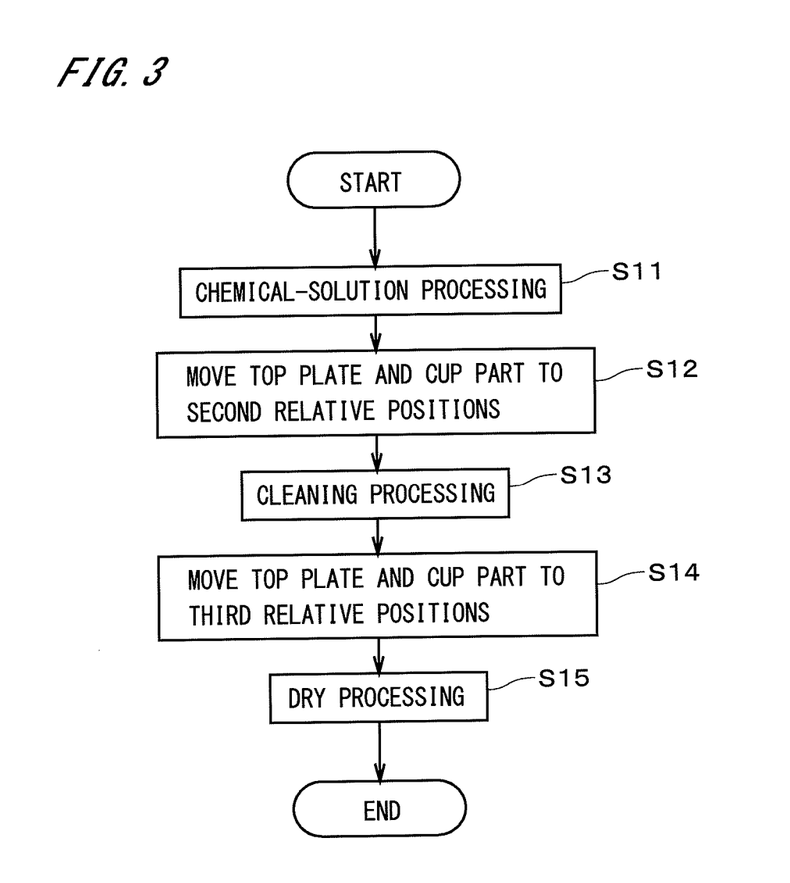
FIG. 3 is a flowchart of processing performed on a substrate.

FIG. 3 is a flowchart of processing performed on the substrate 9 by the substrate processing apparatus 1. In the substrate processing apparatus 1, first, the cup part 41 is moved down by the cup-part movement mechanism 43 such that the upper opening 411 of the cup part 41 is located below the substrate holding part 31. Also, the top plate 51 is moved up by the shielding-plate movement mechanism 53 and widely separated from the substrate holding part 31.

Then, a substrate 9 is conveyed into the housing 11 and held by the substrate holding part 31.

Once the substrate 9 is held, the control part 71 controls the cup-part movement mechanism 43 to move the cup part 41 up to a position illustrated in FIG. 1. The control part 71 also controls the shielding-plate movement mechanism 53 to move the top plate 51 down to a position illustrated in FIG. 1. In the following description, the state where the substrate processing apparatus 1 is as illustrated in FIG. 1 is referred to as a "first processing state." The positions of the top plate 51 and the cup part 41 relative to the substrate 9 in the up-down direction in FIG. 1 are respectively referred to as "first relative positions." A distance in the up-down direction between the lower surface 513 of the top plate 51 located at the first relative position and the upper surface 91 of the substrate 9 is, for example, greater than or equal to 10 mm and less than or equal to 20 mm. In the example in FIG. 1, the distance is approximately 10 mm.

The top plate 51 located at the first relative position and the upper opening 411 of the cup part 41 located at the first relative position are located at approximately the same position in the up-down direction. The outer peripheral edge of the top plate 51 and the inner peripheral edge of the upper opening 411 of the cup part 41 are in close proximity to each other with a slight gap therebetween and oppose each other in the radial direction. Thus, in the first processing state of the substrate processing apparatus 1, the top plate 51 located at the first relative position blocks the upper opening 411 of the cup part 41. The blocking of the upper opening 411 of the cup part 41 by the top plate 51 does not hermetically seal the upper opening 411 and allows the presence of a slight gap. In the state where the upper opening 411 of the cup part 41 is blocked by the top plate 51, the distance in the radial direction between the outer peripheral edge of the top plate 51 and the inner peripheral edge of the upper opening 411 of the cup part 41 is less than or equal to 2 mm. Thus, a gas outside the cup part 41 is substantially prevented from entering the interior of the cup part 41 through the upper opening 411.

The substrate processing apparatus 1 in the first processing state starts the supply of the inert gas to the space between the substrate 9 and the top plate 51 through the upper central nozzle 181. The supply of the inert gas through the upper central nozzle 181 will continue until completion of a series of processes performed on the substrate 9 (i.e., chemical-solution processing, cleaning processing, and dry processing, which will be described later). Thus, the space above the substrate 9 is in a hypoxic atmosphere. The exhaust of the gas in the cup part 41 through the exhaust port 191 will also continue until completion of the series of processes performed on the substrate 9.

Next, the control part 71 controls the substrate rotation mechanism 35 to start rotation of the substrate 9. The control part 71 then controls the chemical-solution supply part 813 to supply the chemical solution to the upper surface 91 of the rotating substrate 9 through the upper central nozzle 181. The chemical solution supplied to the central part of the rotating substrate 9 moves radially outward on the upper surface 91 by a centrifugal force and disperses from the outer edge of the substrate 9 to the cup part 41. The chemical solution received by the cup part 41 is discharged to the outside of the cup part 41 and the housing 11 through the exhaust port 191 at the bottom of the cup part 41 and recovered by the chemical-solution recovery part 195 (see FIG. 2).

The substrate processing apparatus 1 performs chemical-solution processing on the upper surface 91 of the substrate

9 by supplying the chemical solution to the upper surface 91 of the substrate 9 for a predetermined period of time (step S11). The chemical-solution processing in step S11 is performed in the state (i.e., first processing state) where the top plate 51 and the cup part 41 are located at the first relative positions. As described above, the distance in the up-down direction between the lower surface 513 of the top plate 51 located at the first relative position and the upper surface 91 of the substrate 9 is greater than or equal to 10 mm and less than or equal to 20 mm. This prevents the chemical solution from adhering to the lower surface 513 of the top plate 51 during the chemical-solution processing on the substrate 9 and allows the space above the substrate 9 to remain in the hypoxic atmosphere. The supply of the chemical solution from the chemical-solution supply part 813 is stopped when the chemical-solution processing on the substrate 9 has ended.

Figure 4:
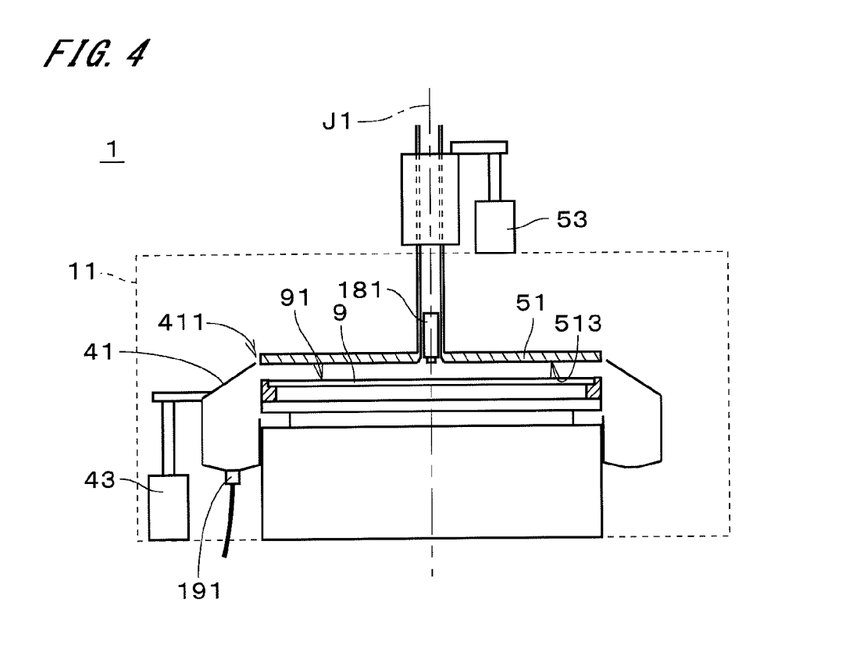
FIG. 4 illustrates the substrate processing apparatus.

Then, the control part 71 controls the cup-part movement mechanism 43 to move the cup part 41 down to a position illustrated in FIG. 4. The control part 71 also controls the shielding-plate movement mechanism 53 to move the top plate 51 down to a position illustrated in FIG. 4. In other words, the top plate 51 and the cup part 41 are moved relative to the substrate 9 in the up-down direction (step S12). In the following description, a state where the substrate processing apparatus 1 is as illustrated in FIG. 4 is referred to as a "second processing state." The positions of the top plate 51 and the cup part 41 relative to the substrate 9 in the up-down direction in FIG. 4 are respectively referred to as "second relative positions."

The top plate 51 located at the second relative position is in closer proximity to the substrate 9 than when it is located at the first relative position. The top plate 51 located at the second relative position opposes the upper surface 91 of the substrate 9 and shields the top of the substrate 9 as in the case where it is located at the first relative position. The cup part 41 located at the second relative position covers the entire periphery of the substrate 9 and the substrate holding part 31 as in the case where it is located at the first relative position.

When the top plate 51 is moved from the first relative position to the second relative position, the chemical atmosphere (i.e., an atmosphere containing mist and fumes of the chemical solution) existing in the space between the top plate 51 and the substrate 9 is pushed out around the substrate 9 and exhausted to the outside of the cup part 41 through the exhaust port 191. A distance in the up-down direction between the lower surface 513 of the top plate 51 located at the second relative position and the upper surface 91 of the substrate 9 is, for example, greater than or equal to 3 mm and less than or equal to 10 mm. In the example in FIG. 4, the distance is approximately 5 mm.

The top plate 51 located at the second relative position and the upper opening 411 of the cup part 41 located at the second relative position are located at approximately the same position in the up-down direction. The outer peripheral edge of the top plate 51 and the inner peripheral edge of the upper opening 411 of the cup part 41 are in close proximity to each other with a slight gap therebetween and oppose each other in the radial direction. Thus, in the second processing state of the substrate processing apparatus 1, the top plate 51 located at the second relative position blocks the upper opening 411 of the cup part 41.

When the top plate 51 is located at the second relative position, the control part 71 controls the cleaning-liquid supply part 814 (see FIG. 2) to supply the cleaning liquid through the upper central nozzle 181 to the upper surface 91 of the rotating substrate 9. The cleaning liquid supplied to the central part of the rotating substrate 9 moves radially outward on the upper surface 91 by a centrifugal force and disperses from the outer edge of the substrate 9 to the cup part 41. The cleaning liquid received by the cup part 41 is discharged to the outside of the cup part 41 and the housing 11 through the exhaust port 191 at the bottom of the cup part 41 and discarded by the drainage part 196 (see FIG. 2).

The substrate processing apparatus 1 performs cleaning processing on the upper surface 91 of the substrate 9 by supplying the cleaning liquid to the upper surface 91 of the substrate 9 for a predetermined period of time (step S13). The cleaning processing in step S13 is performed in the state (i.e., the second processing state) where the top plate 51 and the cup part 41 are located at the second relative positions. During the cleaning processing, the chemical atmosphere existing in the space between the substrate 9 and the top plate 51 located at the second relative position is sucked out through the exhaust port 191, moved to around the substrate 9, and discharged to the outside of the cup part 41 through the exhaust port 191.

As described above, the distance in the up-down direction between the lower surface 513 of the top plate 51 located at the second relative position and the upper surface 91 of the substrate 9 is greater than or equal to 3 mm and less than or equal to 10 mm. This reduces the possibility of the cleaning liquid adhering to the lower surface 513 of the top plate 51 and allows the space above the substrate 9 to remain in the hypoxic atmosphere, during the cleaning processing on the substrate 9. In addition, the chemical atmosphere can be efficiently removed from the space between the substrate 9 and the top plate 51. The supply of the cleaning liquid from the cleaning-liquid supply part 814 is stopped after the cleaning processing on the substrate 9 has ended.

Figure 5:
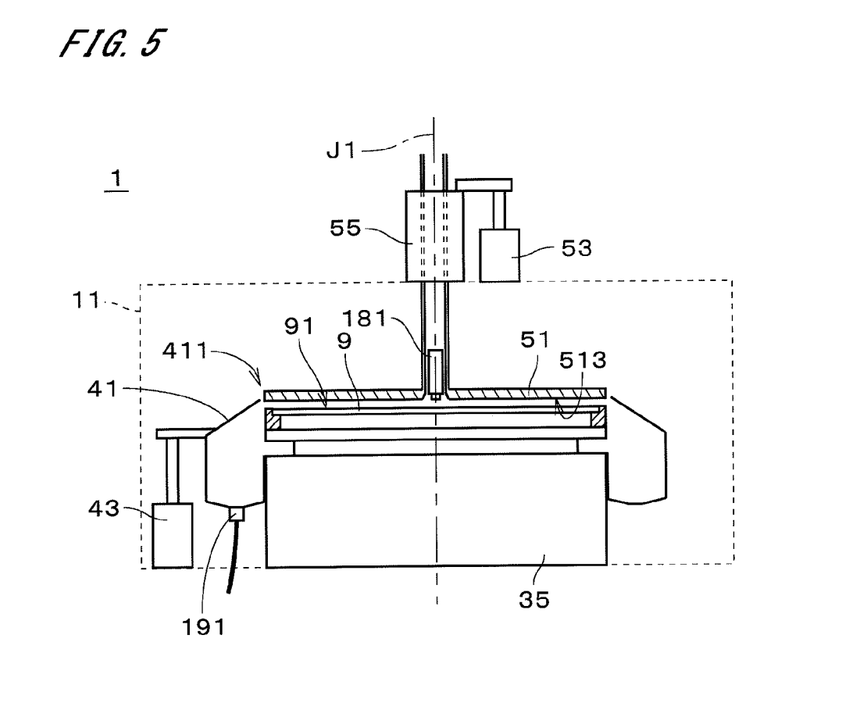
FIG. 5 illustrates the substrate processing apparatus.

Then, the control part 71 controls the cup-part movement mechanism 43 to move the cup part 41 down to a position illustrated in FIG. 5. The control part 71 also controls the shielding-plate movement mechanism 53 to move the top plate 51 down to a position illustrated in FIG. 5. In other words, the top plate 51 and the cup part 41 are moved relative to the substrate 9 in the up-down direction (step S14). In the following description, a state where the substrate processing apparatus 1 is as illustrated in FIG. 5 is referred to as a "third processing state." The positions of the top plate 51 and the cup part 41 relative to the substrate 9 in the up-down direction in FIG. 5 are respectively referred to as "third relative positions."

The top plate 51 located at the third relative position is in closer proximity to the substrate 9 than when it is located at the first and second relative positions. The top plate 51 located at the third relative position opposes the upper surface 91 of the substrate 9 and shields the top of the substrate 9 as in the case where it is located at the first relative position. The cup part 41 located at the third relative position covers the entire periphery of the substrate 9 and the substrate holding part 31 as in the case where it is located at the first relative position. A distance in the up-down direction between the lower surface 513 of the top plate 51 located at the third relative position and the upper surface 91 of the substrate 9 is, for example, greater than or equal to 1 mm and less than or equal to 3 mm. In the example in FIG. 5, the distance is approximately 2.5 mm.

The top plate 51 located at the third relative position and the upper opening 411 of the cup part 41 located at the third relative position are located at approximately the same position in the up-down direction. The outer peripheral edge of the top plate 51 and the inner peripheral edge of the upper opening 411 of the cup part 41 are in close proximity to each other with a slight gap therebetween and oppose each other in the radial direction. Thus, in the third processing state of the substrate processing apparatus 1, the top plate 51 located at the third relative position blocks the upper opening 411 of the cup part 41.

When the top plate 51 is located at the third relative position, the control part 71 controls the substrate rotation mechanism 35 to increase the rotational speed of the substrate 9. Rotating the substrate 9 at a relatively high speed causes the cleaning liquid on the upper surface 91 of the substrate 9 to move radially outward and disperse from the outer edge of the substrate 9 to the periphery thereof. Consequently, the cleaning liquid on the substrate 9 is removed (step S15). Hereinafter, the processing in step S15 is referred to as "dry processing." The cleaning liquid dispersing from the substrate 9 and received by the cup part 41 is discharged to the outside of the cup part 41 and the housing 11 through the exhaust port 191 and discarded by the drainage part 196 (see FIG. 2).

During the dry processing in step S15, the control part 71 controls the shielding-plate rotation mechanism 55 to rotate the top plate 51 at approximately the same rotational speed as the rotational speed of the substrate 9 and in the same rotation direction as the rotation direction of the substrate 9. Disposing the top plate 51 at the third relative position closer to the upper surface 91 of the substrate 9 reduces (or eliminates) the possibility that the cleaning liquid or the like dispersing from the substrate 9 will splash the cup part 41 or the like and adhere again to the upper surface 91 of the substrate 9. In addition, even when the cleaning liquid or the like has adhered to the top plate 51, the cleaning liquid or the like can disperse around the top plate 51 and be removed from above the top plate 51 by rotating the top plate 51.

In the substrate processing apparatus 1, even during the dry processing in step S15, the inert gas is supplied to the space between the lower surface 513 of the top plate 51 and the upper surface 91 of the substrate 9 through the gas outlet 185 (see FIG. 2) of the upper central nozzle 181 as described above. This further increases the speed of discharging the cleaning liquid or the like from the space between the substrate 9 and the top plate 51, thus facilitating the drying of the substrate 9.

When the dry processing on the substrate 9 has ended, the rotation of the substrate 9 and the top plate 51 is stopped, and the supply of the inert gas from the upper central nozzle 181 is stopped. Then, the cup part 41 is moved down by the cup-part movement mechanism 43, and the upper opening 411 of the cup part 41 is located below the substrate 9 and the substrate holding part 31. The top plate 51 is moved up by the shielding-plate movement mechanism 53 and widely separated from the substrate 9 and the substrate holding part 31. Thereafter, the substrate 9 is conveyed out of the housing 11. In the substrate processing apparatus 1, the above-described steps S11 to S15 are sequentially performed on a plurality of substrates 9.

As described above, in the substrate processing apparatus 1, the control part 71 controls the shielding-plate movement mechanism 53, the chemical-solution supply part 813, the cleaning-liquid supply part 814, and the substrate rotation mechanism 35 to first perform chemical-solution processing by supplying the chemical solution to the upper surface 91 of the substrate 9 in the state where the top plate 51 is located at the first relative position relative to the substrate 9 in the up-down direction. Since the top plate 51 located at the first relative position is relatively widely separated from the substrate 9, this prevents the chemical solution supplied onto the substrate 9 from adhering to, for example, the lower surface 513 of the top plate 51.

Next, the top plate 51 is moved down to the second relative position that is closer to the substrate 9 than the first relative position is. Thus, the chemical atmosphere produced in the space between the top plate 51 and the substrate 9 during the chemical-solution processing is pushed out around the substrate 9 and exhausted to the outside of the cup part 41 through the exhaust port 191. This consequently reduces the chemical atmosphere above the substrate 9.

Then, the cleaning processing is performed by supplying the cleaning liquid to the upper surface 91 of the substrate 9 in the state where the top plate 51 is located at the second relative position relative to the substrate 9. Since the top plate 51 located at the second relative position is moderately separated from the substrate 9, the chemical atmosphere existing in the space between the top plate 51 and the substrate 9 can be sucked out from around the substrate 9 and exhausted to the outside of the cup part 41 through the exhaust port 191 more efficiently than in the state where the top plate 51 is in extremely close proximity to the substrate 9 (i.e., the state where the top plate 51 is located at the third relative position). Consequently, the chemical atmosphere above the substrate 9 can be removed efficiently during the cleaning processing, which is performed for a predetermined period of time.

In the substrate processing apparatus 1, the top plate 51 is further moved down to the third relative position that is closer to the substrate 9 than the second relative position is. Then, the dry processing is performed on the substrate 9 by rotating the substrate 9 at a relatively high speed. Since, as described above, the chemical atmosphere produced in the space between the top plate 51 and the substrate 9 is efficiently removed from the space before the top plate 51 is located at the third relative position, the occurrence of particles due to the chemical atmosphere above the substrate 9 can be suppressed (or prevented) during the dry processing.

In the substrate processing apparatus 1, the top plate 51 is moved from the first relative position to the second relative position before the cleaning processing is performed, and is kept at the second relative position until completion of the cleaning processing. This allows the chemical atmosphere above the substrate 9 to be always removed efficiently during the cleaning processing. Thus, the occurrence of particles due to the chemical atmosphere above the substrate 9 can be further suppressed (or prevented) during the dry processing.

In the substrate processing apparatus 1, the inert gas is continuously supplied from the upper central nozzle 181 to the space between the top plate 51 and the substrate 9 during the series of processes performed on the substrate 9, including the chemical-solution processing, the cleaning processing, and the dry processing. The series of processes can thus be performed in a hypoxic atmosphere. In addition, the supply of the inert gas from the upper central nozzle 181 during the cleaning processing on the substrate 9 further improves the efficiency of removing the chemical atmosphere from the space between the top plate 51 and the substrate 9. The supply of the inert gas from the upper central nozzle 181 during the dry processing on the substrate 9 also improves the efficiency of drying the substrate 9.

As described above, in the substrate processing apparatus 1, the gas is sucked out through the exhaust port 191 in the state where the upper opening 411 of the cup part 41 is blocked by the top plate 51 located at the second relative position during the cleaning processing on the substrate 9.

Thus, the chemical atmosphere between the top plate 51 and the substrate 9 can be sucked out from around the substrate 9 more efficiently than in the state where the upper opening 411 of the cup part 41 is open (e.g., a state where the top plate 51 is widely separated from the upper opening 411 of the cup part 41 in the up-down direction and there is a relatively large space between the top plate 51 and the upper opening 411). Consequently, the chemical atmosphere above the substrate 9 can be removed more efficiently during the cleaning processing on the substrate 9.

In the substrate processing apparatus 1, the chemical-solution processing is performed on the substrate 9 in the state where the upper opening 411 of the cup part 41 is blocked by the top plate 51 located at the first relative position. Thus, the chemical atmosphere between the top plate 51 and the substrate 9 can be sucked out from around the substrate 9 more efficiently than in the state where the upper opening 411 of the cup part 41 is open. This consequently reduces the concentration of the chemical atmosphere above the substrate 9 at the time of chemical-solution processing termination and further improves the efficiency of removing the chemical atmosphere above the substrate 9 during the cleaning processing on the substrate 9. In addition, blocking the upper opening 411 of the cup part 41 reduces (or eliminates) the possibility that the chemical atmosphere produced above the substrate 9 will be diffused to the outside of the cup part 41 through the upper opening 411. Consequently, the occurrence of particles outside the cup part 41 can be suppressed (or prevented).

In the substrate processing apparatus 1, the dry processing is performed on the substrate 9 in the state where the upper opening 411 of the cup part 41 is blocked by the top plate 51 located at the third relative position. This improves suction efficiency in sucking out the gas between the top plate 51 and the substrate 9 from around the substrate 9 as compared to the state where the upper opening 411 of the cup part 41 is open. Consequently, the substrate 9 can be dried efficiently.

Figure 6:
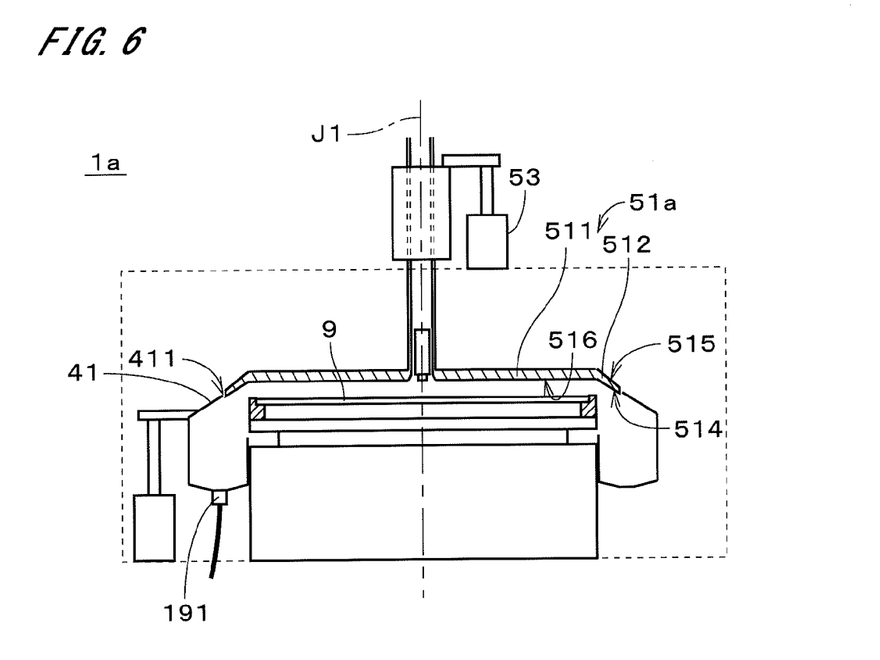
FIG. 6 illustrates a configuration of a substrate processing apparatus according to a second embodiment.

FIG. 6 illustrates a configuration of a substrate processing apparatus 1a according to a second embodiment of the present invention. As illustrated in FIG. 6, the substrate processing apparatus 1a has approximately the same structure as that of the substrate processing apparatus 1 illustrated in FIG. 1, with the exception that the top plate 51 illustrated in FIG. 1 is replaced by a top plate 51a that has a different structure from that of the top plate 51. In the following description, constituent elements of the substrate processing apparatus 1a that correspond to those of the substrate processing apparatus 1 are given the same reference numerals.

As illustrated in FIG. 6, the top plate 51a includes a plate main part 511 that is a shielding-plate main part, and a plate peripheral part 512 that is a shielding-plate peripheral part. The plate main part 511 and the plate peripheral part 512 form an integral member. The plate main part 511 is a generally disc-shaped member that is approximately perpendicular to the central axis J1, and opposes the substrate 9 above the substrate 9. The shape and dimensions of the plate main part 511 are approximately the same as those of the top plate 51 illustrated in FIG. 1. The plate main part 511 has a main-part lower surface 516 that covers the upper surface 91 of the substrate 9. The diameter of the main-part lower surface 516 of the plate main part 511 is greater than the diameter of the substrate 9, and the outer peripheral edge of the main-part lower surface 516 of the plate main part 511 is entirely located radially outward of the outer peripheral edge of the substrate 9.

The plate peripheral part 512 is an annular member that extends downward from the outer periphery of the plate main part 511. In the example in FIG. 6, the plate peripheral part 512 is a plate-like inclined part that extends radially outward and downward from the outer periphery of the plate main part 511. The plate peripheral part 512 has an inner peripheral surface 514 and an outer peripheral surface 515. The inner peripheral surface 514 of the plate peripheral part 512 extends radially outward and downward from the outer peripheral edge of the main-part lower surface 516 of the plate main part 511. The diameter of the upper opening 411 of the cup part 41 is slightly greater than the diameter of the lower edge of the plate peripheral part 512.

A flowchart of processing performed on the substrate 9 by the substrate processing apparatus 1a is the same as the flowchart of processing (see FIG. 3) performed on the substrate 9 by the substrate processing apparatus 1 illustrated in FIG. 1. Like the substrate processing apparatus 1, the substrate processing apparatus 1a can efficiently remove the chemical atmosphere above the substrate 9 during the cleaning processing. In step S12, as described above, the top plate 51a is moved down from the first relative position to the second relative position in FIG. 6 by the shielding-plate movement mechanism 53 and approaches the substrate 9. Thus, the chemical atmosphere produced in the space between the top plate 51a and the substrate 9 during the chemical-solution processing in step S11 is pushed out around the substrate 9 and exhausted to the outside of the cup part 41 through the exhaust port 191. This consequently reduces the chemical atmosphere above the substrate 9.

As described above, the top plate 51a has the plate peripheral part 512 around the plate main part 511, and the inner peripheral surface 514 of the plate peripheral part 512 extends downward from the outer peripheral edge of the main-part lower surface 516 of the plate main part 511. Thus, when the top plate 51a is moved down in step S12, the chemical atmosphere pushed out peripherally from above the substrate 9 is guided downward along the inner peripheral surface 514 of the plate peripheral part 512. In other words, the chemical atmosphere pushed out peripherally from above the substrate 9 is guided to the exhaust port 191 at the bottom of the cup part 41 along the inner peripheral surface 514 of the plate peripheral part 512. Thus, the chemical atmosphere pushed out peripherally from above the substrate 9 can be more efficiently exhausted to the outside of the cup part 41. This consequently further reduces the chemical atmosphere above the substrate 9.

Figure 7:
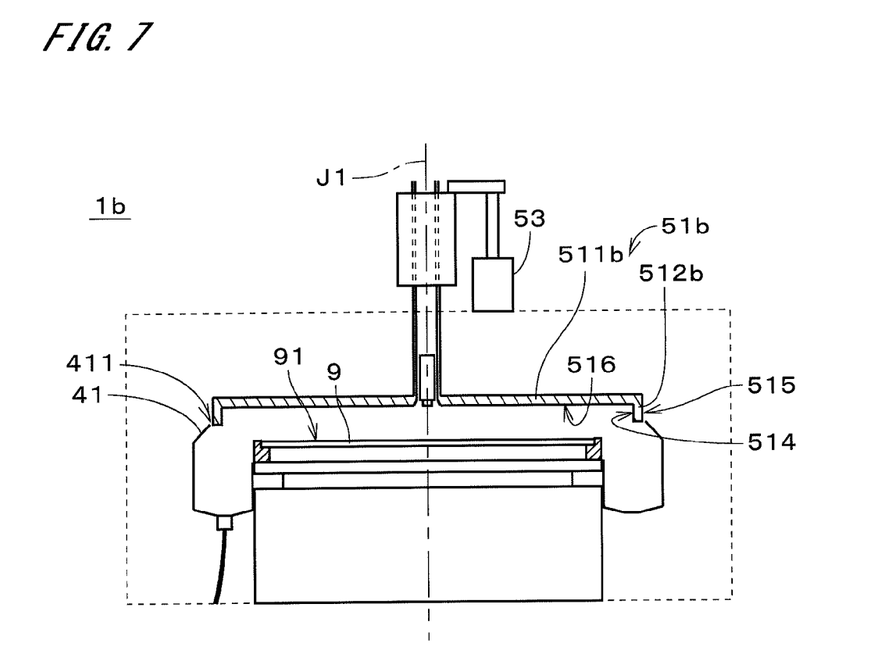
FIG. 7 illustrates a configuration of a substrate processing apparatus according to a third embodiment.

FIG. 7 illustrates a configuration of a substrate processing apparatus 1b according to a third embodiment of the present invention. As illustrated in FIG. 7, the substrate processing apparatus 1b has approximately the same structure as that of the substrate processing apparatus 1 illustrated in FIG. 1, with the exception that the top plate 51 in FIG. 1 is replaced by a top plate 51b that has a different structure from that of the top plate 51 and that the cup-part movement mechanism 43 has been omitted. In the following description, constituent elements of the substrate processing apparatus 1b that correspond to those of the substrate processing apparatus 1 are given the same reference numerals.

As illustrated in FIG. 7, the top plate 51b includes a plate main part 511b that is a shielding-plate main part, and a plate peripheral part 512b that is a shielding-plate peripheral part. The plate main part 511b and the plate peripheral part 512b form an integral member. The plate main part 511b is a generally disc-shaped member that is approximately perpendicular to the central axis J1, and opposes the substrate 9 above the substrate 9. The diameter of the plate main part 511b is greater than the diameters of the top plate 51 and the plate main part 511 described above.

The plate peripheral part 512b is an annular member that extends downward from the outer periphery of the plate main part 511b. In the example in FIG. 7, the plate peripheral part 512b is a generally cylindrical member that extends downward from the outer peripheral edge of the plate main part 511b. The plate peripheral part 512b has an inner peripheral surface 514 and an outer peripheral surface 515. The inner peripheral surface 514 and the outer peripheral surface 515 of the plate peripheral part 512b are generally cylindrical surfaces that extend about the central axis J1 in the up-down direction. The inner peripheral surface 514 of the plate peripheral part 512b extends downward from the outer peripheral edge of the main-part lower surface 516 of the plate main part 511b. The diameter of the inner peripheral surface 514 of the plate peripheral part 512b is greater than the diameter of the substrate 9, and the lower edge of the inner peripheral surface 514 of the plate peripheral part 512b is entirely located radially outward of the outer peripheral edge of the substrate 9. The diameter of the upper opening 411 of the cup part 41 is slightly greater than the diameter of the outer peripheral surface 515 of the plate peripheral part 512b.

A flowchart of processing performed on the substrate 9 by the substrate processing apparatus 1b is approximately the same as the flowchart of processing performed on the substrate 9 by the substrate processing apparatus 1 illustrated in FIG. 1. Like the substrate processing apparatus 1, the substrate processing apparatus 1b performs chemical-solution processing by supplying a chemical solution to the upper surface 91 of the substrate 9 in the state where the top plate 51b is located at the first relative position illustrated in FIG. 7 (FIG. 3: step S11). In the state where the top plate 51b is located at the first relative position, the lower end of the outer peripheral surface 515 of the plate peripheral part 512b is in close proximity to the inner peripheral edge of the upper opening 411 of the cup part 41 with a slight gap therebetween, and they oppose each other in the radial direction. Thus, the upper opening 411 of the cup part 41 is blocked by the top plate 51b.

Figure 8:
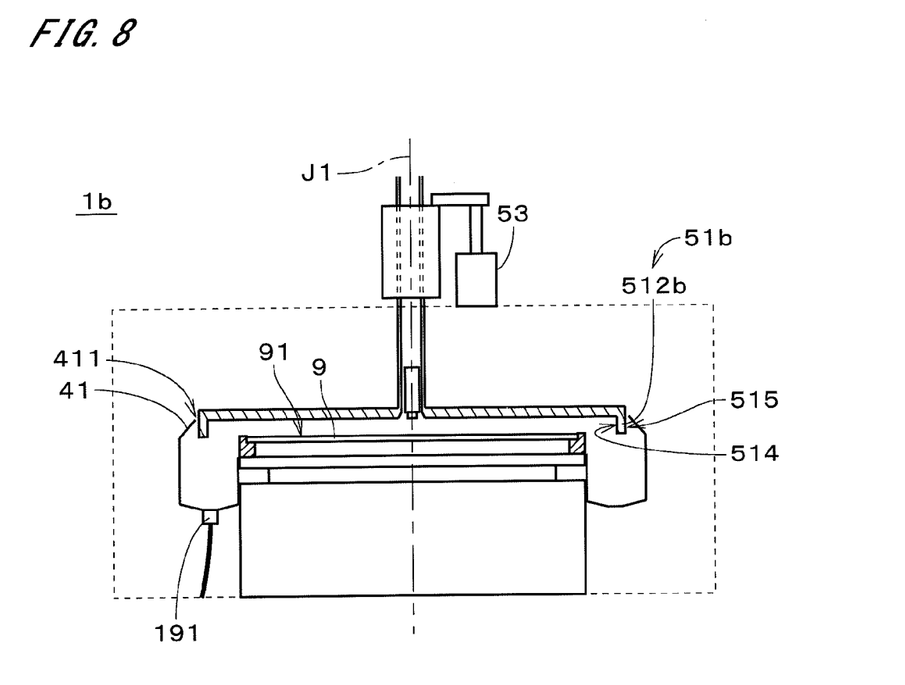
FIG. 8 illustrates the substrate processing apparatus.

When the chemical-solution processing has ended, the top plate 51b is moved down by the shielding-plate movement mechanism 53 and located at the second relative position that is closer to the substrate 9 than the first relative position is, as illustrated in FIG. 8 (step S12). At this time, the cup part 41 does not move in the up-down direction. Then, cleaning processing is performed by supplying a cleaning liquid to the upper surface 91 of the substrate 9 in the state where the top plate 51b is located at the second relative position (step S13). In the state where the top plate 51b is located at the second relative position, the central part of the outer peripheral surface 515 of the plate peripheral part 512b in the up-down direction is in close proximity to the inner peripheral edge of the upper opening 411 of the cup part 41 with a slight gap therebetween, and they oppose each other in the radial direction. Thus, the upper opening 411 of the cup part 41 is blocked by the top plate 51b.

Figure 9:
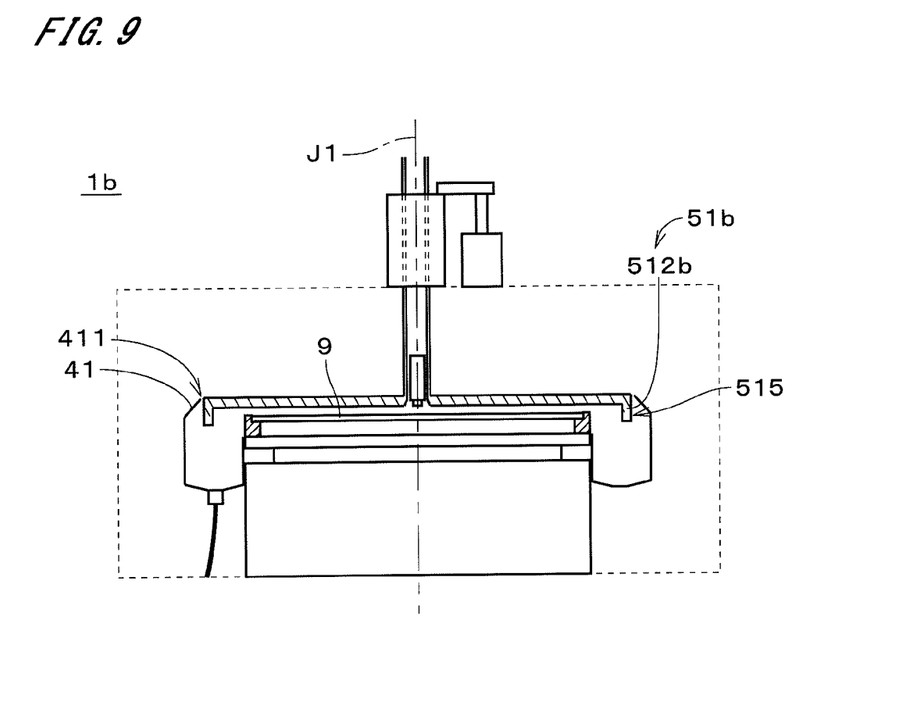
FIG. 9 illustrates the substrate processing apparatus.

When the cleaning processing has ended, the top plate 51b is moved down to the third relative position that is closer to the substrate 9 than the second relative position is, as illustrated in FIG. 9 (step S14). At this time, the cup part 41 does not move in the up-down direction. Then, dry processing is performed by rotating the substrate 9 at a relatively high speed in the state where the top plate 51b is located at the third relative position (step S15). In the state where the top plate 51b is located at the third relative position, the upper end of the outer peripheral surface 515 of the plate peripheral part 512b is in close proximity to the inner peripheral edge of the upper opening 411 of the cup part 41 with a slight gap therebetween, and they oppose each other in the radial direction. Thus, the upper opening 411 of the cup part 41 is blocked by the top plate 51b.

By performing the above-described steps S11 to S15, the substrate processing apparatus 1b can efficiently remove the chemical atmosphere above the substrate 9 during the cleaning processing, as in the case of the substrate processing apparatus 1 illustrated in FIG. 1. In addition, the plate peripheral part 512b of the top plate 51b allows the chemical atmosphere pushed out peripherally from above the substrate 9 to be guided to the exhaust port 191 at the bottom of the cup part 41 along the inner peripheral surface 514 of the plate peripheral part 512b when the top plate 51b is moved down to the second relative position illustrated in FIG. 8 in step S12, as in the case of the substrate processing apparatus 1a illustrated in FIG. 6. Thus, the chemical atmosphere pushed out peripherally from above the substrate 9 can be more efficiently exhausted to the outside of the cup part 41. This consequently further reduces the chemical atmosphere above the substrate 9.

As described above, in the substrate processing apparatus 1b, the outer peripheral surface 515 of the plate peripheral part 512b and the inner peripheral edge of the upper opening 411 of the cup part 41 oppose each other in close proximity in states where the top plate 51b is located at any of the first relative position, the second relative position, and the third relative position. Thus, the upper opening 411 of the cup part 41 can be blocked by the top plate 51b without moving the cup part 41 in the up-down direction. In this way, the substrate processing apparatus 1b allows the upper opening 411 of the cup part 41 to be blocked with a simple structure in processing states of any of the chemical-solution processing, the cleaning processing, and the dry processing.

The above-described substrate processing apparatuses 1, 1a, and 1b can be modified in various ways.

For example, the shielding-plate movement mechanism 53 in the substrate processing apparatuses 1, 1a, and 1b may be any mechanism for moving the top plate 51 relative to the substrate 9 and the substrate holding part 31 in the up-down direction. The cup-part movement mechanism 43 in the substrate processing apparatuses 1 and 1a may be any mechanism for moving the cup part 41 relative to the substrate 9 and the substrate holding part 31 in the up-down direction. For example, the substrate processing apparatuses 1, 1a, and 1b may be provided with a substrate movement mechanism for moving the substrate 9 along with the substrate holding part 31 in the up-down direction in a state where the position of the top plate 51, 51a, or 51b and the cup part 41 in the up-down direction are fixed. The positions of the top plate 51, 51a, or 51b relative to the substrate 9 that result from the substrate 9 being moved in the up-down direction by the substrate movement mechanism may be taken as the above-described first, second, and third relative positions. In this case, the substrate movement mechanism is a shielding-plate movement mechanism for moving the top plate 51, 51a, or 51b relative to the substrate 9 in the up-down direction.

In the substrate processing apparatuses 1, 1a, and 1b, the top plate 51, 51a, or 51b at any one or all of the first, second, and third relative positions may be located above or below the upper opening 411 of the cup part 41 so that the upper opening 411 is open without being blocked.

The substrate processing apparatuses 1, 1a, and 1b may omit the cup part 41. In this case, the exhaust port 191 is provided in the housing 11 at a location below the substrate 9. In the substrate processing apparatuses 1a and 1b, when the top plate 51a or 51b is moved down in step S12, the chemical atmosphere pushed out peripherally from above the substrate 9 is guided to the exhaust port 191 disposed below the substrate 9 along the inner peripheral surface 514 of the plate peripheral part 512 or 512b. This improves the efficiency of exhausting the chemical atmosphere that is pushed out peripherally from above the substrate 9, and consequently reduces the chemical atmosphere above the substrate 9.

The cup part 41 in the substrate processing apparatuses 1, 1a, and 1b may include a plurality of cups that are disposed concentrically. In this case, the cup that receives the processing liquid from the substrate 9 is desirably switched when the type of processing liquid supplied onto the substrate 9 is switched (e.g., switched from a chemical solution to a cleaning liquid). This facilitates separation and recovery or disposal of a plurality of processing liquids.

The substrate processing apparatuses 1, 1a, and 1b may be configured such that a lower nozzle is provided at the central part of the substrate holding part 31, a chemical solution is supplied to the lower surface of the substrate 9 in parallel with the chemical-solution processing performed on the upper surface 91 of the substrate 9, and a cleaning liquid is supplied to the lower surface of the substrate 9 in parallel with the cleaning processing performed on the upper surface 91 of the substrate 9.

The chemical-solution processing in step S11 is not limited to polymer removal or etching, and may be various types of processing using various processing liquids such as hydrochloric acid or hydrofluoric acid. The substrate processing apparatuses 1, 1a, and 1b can perform various types of desirable processing in a hypoxic environment by using the top plate 51, 51a, or 51b. The inert gas supplied from the upper central nozzle 181 is not limited to a nitrogen gas, and may be other inert gases such as argon. The gas supplied from the upper central nozzle 181 may be a gas for producing a desired gaseous atmosphere above the substrate 9, such as a mixed gas (e.g., a gas obtained by mixing a plurality of types of gases) whose composition ratio is controlled. In the substrate processing apparatuses 1, 1a, and 1b, the supply of a gas from the upper central nozzle 181 is not an absolute necessity. The substrate processing apparatuses 1, 1a, and 1b may perform processing on various substrates other than semiconductor substrates.

The configurations of the above-described preferred embodiments and variations may be appropriately combined as long as there are no mutual inconsistencies.

While the invention has been shown and described in detail, the foregoing description is in all aspects illustrative and not restrictive. It is therefore to be understood that numerous modifications and variations can be devised without departing from the scope of the invention. This application claims priority benefit under 35 U.S.C. Section 119 of Japanese Patent Application No. 2014-198208 filed in the Japan Patent Office on Sep. 29, 2014, the entire disclosure of which is incorporated herein by reference.

REFERENCE SIGNS LIST 1, 1a, 1b Substrate processing apparatus
9 Substrate
31 Substrate holding part
35 Substrate rotation mechanism
41 Cup part
51, 51a, 51b Top plate
53 Shielding-plate movement mechanism
55 Shielding-plate rotation mechanism
71 Control part
91 Upper surface
191 Exhaust port
411 Upper opening
511, 511b Plate main part
512, 512b Plate peripheral part
514 Inner peripheral surface (of plate peripheral part)
515 Outer peripheral surface (of plate peripheral part)
516 Main-part lower surface
813 Chemical-solution supply part
814 Cleaning-liquid supply part
J1 Central axis
S11 to S15 Step

The invention claimed is:

1. A substrate processing method of processing a substrate, comprising:
  a) performing chemical-solution processing by supplying a chemical solution to an upper surface of a substrate held in a horizontal state in a state where a shielding plate that opposes said upper surface of said substrate is located at a first relative position relative to said substrate in an up-down direction;
  b) after said operation a), pushing a chemical atmosphere existing in a space between said shielding plate and said substrate out around said substrate by moving said shielding plate relative to said substrate in said up-down direction from said first relative position to a second relative position that is closer to said substrate than said first relative position;
  c) after said operation b), performing cleaning processing by supplying a cleaning liquid to said upper surface of said substrate in a state where said shielding plate is located at said second relative position;
  d) after said operation c), moving said shielding plate relative to said substrate in said up-down direction from said second relative position to a third relative position that is closer to said substrate than said second relative position;
  e) after said operation d), performing dry processing by rotating said substrate in a state where said shielding plate is located at said third relative position.

2. The substrate processing method according to claim 1, wherein
  a cup part that covers a periphery of said substrate and has an upper opening above said substrate receives said cleaning liquid from said substrate,
  an exhaust port that is provided in said cup part at a position below said substrate sucks and exhausts said chemical atmosphere to outside of said cup part, and
  in said operation c), said shielding plate located at said second relative position blocks said upper opening of said cup part.

3. The substrate processing method according to claim 2, wherein
  in said operation a), said shielding plate located at said first relative position blocks said upper opening of said cup part.

4. The substrate processing method according to claim 3, wherein
  in said operation e), said shielding plate located at said third relative position blocks said upper opening of said cup part.

* * * * *